United States Patent
Sakamoto et al.

(10) Patent No.: US 9,085,032 B2
(45) Date of Patent: Jul. 21, 2015

(54) CUTTING TOOL

(75) Inventors: Yoshiki Sakamoto, Satsumasendai (JP); Masahiro Waki, Satsumasendai (JP); Yaocan Zhu, Satsumasendai (JP)

(73) Assignee: KYOCERA CORPORATION, Kyoto-shi, Kyoto (JP)

( * ) Notice: Subject to any disclaimer, the term of this patent is extended or adjusted under 35 U.S.C. 154(b) by 0 days.

(21) Appl. No.: 14/234,617

(22) PCT Filed: Jul. 25, 2012

(86) PCT No.: PCT/JP2012/068793
§ 371 (c)(1),
(2), (4) Date: May 16, 2014

(87) PCT Pub. No.: WO2013/015302
PCT Pub. Date: Jan. 31, 2013

(65) Prior Publication Data
US 2014/0271000 A1    Sep. 18, 2014

(30) Foreign Application Priority Data
Jul. 25, 2011 (JP) .................... 2011-162250

(51) Int. Cl.
*B23B 27/14* (2006.01)
*C23C 30/00* (2006.01)

(52) U.S. Cl.
CPC ............. *B23B 27/148* (2013.01); *C23C 30/005* (2013.01); *Y10T 407/27* (2015.01)

(58) Field of Classification Search
USPC ............. 51/307, 309; 428/325, 697, 698, 699
See application file for complete search history.

(56) References Cited

U.S. PATENT DOCUMENTS

| | | | | |
|---|---|---|---|---|
| 5,272,014 A | * | 12/1993 | Leyendecker et al. | ........ 428/457 |
| 6,838,151 B2 | * | 1/2005 | Kato | ............................. 428/332 |
| 7,226,670 B2 | * | 6/2007 | Derflinger et al. | ............ 428/699 |

(Continued)

FOREIGN PATENT DOCUMENTS

| | | | |
|---|---|---|---|
| JP | 2002-346812 | | 12/2002 |
| JP | 2003-071611 | * | 3/2003 |
| JP | 2003-305601 | | 10/2003 |

(Continued)

OTHER PUBLICATIONS

English Translation of International Search Report issued in PCT/JP2012/068793 dated Aug. 13, 2012.

*Primary Examiner* — Archene Turner

(57) ABSTRACT

A cutting tool including a base member and a coating layer. The base member includes a rake face and a flank face. The coating layer has a composition represented by a first chemical formula of $Cr_aM_{1-a}(C_{1-x}N_x)$, wherein M represents at least one selected from Ti, Al, Si, W, Mo, Ta, Hf, Nb, Zr, and Y, $0.01 \leq a \leq 0.5$, and $0 \leq x \leq 1$. The coating layer is disposed on the base member and includes a cutting edge at an intersecting ridge line between the rake face and the flank face. The coating layer further comprises droplets thereon. An average composition of the droplets disposed on the rake face has a Cr content higher than the Cr content of the average composition of the droplets disposed on the flank face.

6 Claims, 1 Drawing Sheet

(56) References Cited

U.S. PATENT DOCUMENTS

| | | | |
|---|---|---|---|
| 7,960,016 B2 * | 6/2011 | Lechthaler et al. | 428/698 |
| 8,304,098 B2 * | 11/2012 | Kubota et al. | 428/699 |
| 8,586,214 B2 * | 11/2013 | Sakamoto et al. | 51/307 |
| 8,623,525 B2 * | 1/2014 | Waki et al. | 51/309 |
| 2002/0176753 A1 | 11/2002 | Kato | |
| 2013/0022419 A1 | 1/2013 | Sakamoto et al. | |

FOREIGN PATENT DOCUMENTS

| | | |
|---|---|---|
| JP | 2005-271155 | 10/2005 |
| JP | 2008-264975 | 11/2008 |
| WO | 2011122554 | 10/2011 |

* cited by examiner

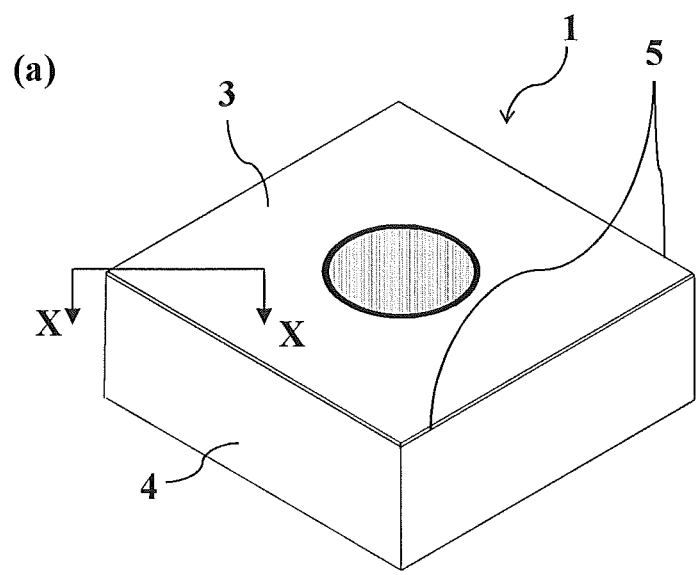
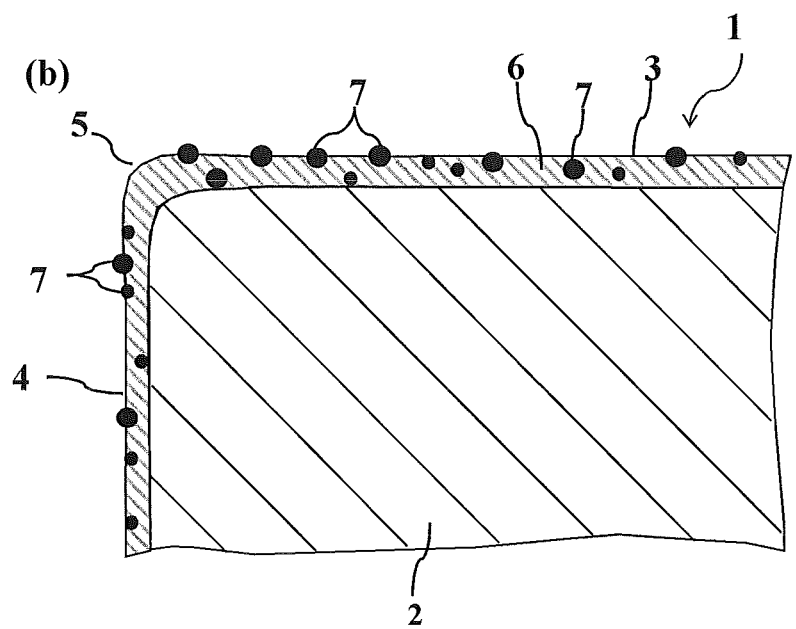

CUTTING TOOL

CROSS-REFERENCE TO RELATED APPLICATIONS

This application is a national phase of the International application PCT/JP2012/068793 filed Jul. 25, 2012 that claims priority from the Japanese patent application JP2011-162250 filed Jul. 25, 2011. The contents of these aforementioned documents is herewith incorporated by reference.

TECHNICAL FIELD OF THE INVENTION

The present invention relates to a cutting tool including a coating layer formed on a surface of a base body.

BACKGROUND OF THE INVENTION

Currently, the wear resistance, slidability, and fracture resistance of members, such as cutting tools, wear resistant members, and slidable members, requiring high wear resistance, slidability, and fracture resistance are increased by forming coating layers on the surfaces of base bodys each made of a sintered alloy such as a ultra-hard alloy or a cermet, a sintered compact having high hardness such as diamond or cubic boron nitride (cBN), or ceramics such as alumina or silicon nitride.

In addition, nitride layers mainly made of Ti or Al have been actively studied through physical vapor deposition such as arc ion plating or sputtering and have been continuously improved for extending the life of tools. In addition to the coating material elements, these surface-covered tools have been variously contrived for corresponding to changes in the cutting environment, such as an increase in cutting speed, and diversification of work materials.

For example, Japanese Unexamined Patent Application Publication No. 2008-264975 discloses a surface-covered tool including a film of, for example, TiAlN formed on a surface of a base body wherein the ratio of Ti in the flank face is larger than that in the rake face. Japanese Unexamined Patent Application Publication No. 2002-346812 discloses a hard TiAlN film having a thickness of 1 to 5 μm formed on a surface of a base body material and including coarse particles having a size larger than the thickness of the hard film in an amount of 5% by area or less to give a surface roughness Ra of 0.1 μm or less or a surface roughness Rz of 1 μm or less. Japanese Unexamined Patent Application Publication No. 2005-271155 discloses a coating film having a composition of, for example, (AlCrV)N, formed on a surface of a base body material and reducing the number of microparticles present on the surface of the coating film.

The following is a list of the aforementioned background art

PTL 1: Japanese Unexamined Patent Application Publication No. 2008-264975

PTL 2: Japanese Unexamined Patent Application Publication No. 2002-346812

PTL 3: Japanese Unexamined Patent Application Publication No. 2005-271155

SUMMARY OF INVENTION

Technical Problem

Even in the structure described in Japanese Unexamined Patent Application Publication No. 2008-264975 in which the ratio of Ti in the flank face is larger than that in the rake face, the heat resistance and the oxidation resistance of the coating layer of the rake face are insufficient, and the fracture resistance of the flank face is also insufficient. Even in the structure described in Japanese Unexamined Patent Application Publication No. 2002-346812 in which the number of coarse particles is reduced to the utmost, the fracture resistance of the coating layer is insufficient. Addition of Cr as a third metal to TiAlN, as the composition shown in Japanese Unexamined Patent Application Publication No. 2005-271155, improves the wear resistance, but a further improvement is necessary. In particular, chipping or peeling of a film occurs depending on the internal stress of the coating layer in some cases, and a further improvement in fracture resistance has been demanded.

The present invention has been accomplished for solving the above-mentioned problems, and it is an object thereof to provide a cutting tool including a coating layer that can exhibit optimum cutting performance for each local area.

SUMMARY OF THE INVENTION

In a cutting tool of the present invention, a coating layer, which is composed of $Cr_aM_{1-a}(C_{1-x}N_x)$ (wherein M represents at least one selected from Ti, Al, Si, W, Mo, Ta, Hf, Nb, Zr, and Y, $0.01 \leq a \leq 0.5$, and $0 \leq x \leq 1$), covers a surface of a base body and includes a cutting edge at an intersecting ridge line between a rake face and a flank face. Droplets exist on a surface of the coating layer, and an average composition of droplets existing on the rake face has a Cr content ratio higher than the Cr content ratio of the average composition of the droplets existing on the flank face.

Advantageous Effects of Invention

In the cutting tool of the present invention, droplets exist on the surface of a coating layer that covers a base body. Even if chips pass on the rake face during cutting, the presence of droplets containing a large amount of Cr prevents the chips from coming into flat contact with the rake face, and the temperature of the surface of the coating layer is not increased too much. In addition, since the rake face has a Cr content ratio higher than that of the flank face, the lubricity of the droplets existing on the rake face is high to reduce the frictional resistance with chips; and since the flank face has a low Cr ratio in the droplets, the chips disappears early to improve the finished surface state in machining.

BRIEF DESCRIPTION OF DRAWINGS

FIG. 1 includes a schematic perspective view (a) of an example of the cutting tool of the present invention and a cross-sectional view (b) taken along line X-X in the view (a).

DETAILED DESCRIPTION OF THE DRAWINGS

A preferred embodiment of the cutting tool of the present invention will be described with reference to FIG. 1 (the schematic perspective view (a) and the cross-sectional view (b) taken along line X-X in the view (a)).

As shown in FIG. 1, the cutting tool 1 includes a rake face 3 on a principal surface, a flank face 4 on a side face, and a cutting edge 5 at the intersecting ridge line between the rake face 3 and flank face 4 and has a structure including a coating layer 6 formed on the surface of a base body 2.

The surface of the base body 2 is covered with the coating layer 6 having a composition represented by $Cr_aM_{1-a}(C_{1-x}N_x)$ (wherein, M represents at least one selected from Ti, Al, Si, W, Mo, Ta, Hf, Nb, Zr, and Y, $0.01 \leq a \leq 0.5$, and $0 \leq x \leq 1$). As shown in FIG. 1(b), on the surface of the coating layer 6, droplets 7, a particulate material having a composition different from that of the coating layer 6, exist. The Cr content ratio in the average composition of the droplets 7 existing on the rake face 3 is higher than that in the average composition of the droplets 7 existing on the flank face 4. Herein, the average compositions of the droplets existing on the rake face 3 and the flank face 4 in the present invention each refer to the average value determined through microscopic observation of the rake face 3 or the flank face 4 and measuring the composition of each droplet having a diameter of 0.3 μm or more existing within any visual field of 10×10 μm by energy dispersive spectroscopy (EDS).

In this structure, even if chips pass on the rake face 3 during cutting, the presence of the droplets 7 prevents the chips from coming into flat contact with the rake face, and the temperature of the surface of the coating layer 6 is not increased too much. In addition, since the Cr content ratio in the droplets 7 on the rake face 3 is higher than that in the droplets 7 on the flank face 4, the lubricity of the droplets 7 existing on the rake face 3 is high, and an effect of holding cutting fluid on the surface of the coating layer 6 is exhibited. Since the Cr content ratio in the droplets 7 on the flank face 4 is, however, low, the cutting fluid disappears early to improve the finished surface conditions in machining.

The coating layer 6 preferably contains at least one of Ti and Al as M in the above-mentioned composition formula. In such a case, the coating layer 6 can have high hardness and toughness, and the cutting tool 1 can have improved wear resistance and fracture resistance. Furthermore, coating layer 6 preferably has a composition containing Ti as M, a composition containing Ti and Al as M, or a composition containing at least one (M') selected from Si, W, Mo, Ta, Hf, Nb, Zr, and Y. Specifically, the composition is represented by $Cr_aTi_bAl_cM'_d(C_{1-x}N_x)$, wherein, M' represents at least one selected from Si, W, Mo, Ta, Hf, Nb, Zr, and Y, $0.01 \leq a \leq 0.25$, $0.3 \leq b \leq 0.8$, $0 \leq c \leq 0.6$, $0 \leq d \leq 0.25$, $a+b+c+d=1$, and $0 \leq x \leq 1$. In this composition, the coating layer 6 can have high oxidation starting temperature and high oxidation resistance and can reduce the internal stress therein, resulting in high fracture resistance. In addition, coating layer 6 has high hardness and high adhesion with the base body 2 and therefore shows high wear resistance and fracture resistance under severe cutting conditions such as machining of difficult-to-machine materials, dry cutting, and high-speed cutting.

That is, a coating layer 6 having "a" (composition ratio of metal Cr) being smaller than 0.01 has low oxidation resistance and lubricity, whereas a coating layer 6 having "a" (composition ratio of metal Cr) being larger than 0.5 has low wear resistance. A particularly preferred range of "a" is $0.04 \leq a \leq 0.15$. When "b" (composition ratio of Ti) is 0.3 or more, the crystal structure of the coating layer 6 does not shift from a cubic crystal to a hexagonal crystal, resulting in high hardness and wear resistance. When "b" (composition ratio of Ti) is 0.8 or less, the coating layer 6 has high oxidation resistance and heat resistance. A particularly preferred range of "b" is $0.45 \leq b \leq 0.5$. When "c" (composition ratio Al) is 0.6 or less, the crystal structure of the coating layer 6 does not shift from a cubic crystal to a hexagonal crystal, resulting in maintenance of high hardness. A particularly preferred range of "c" is $0.48 \leq c \leq 0.52$. When "d" (composition ratio of metal M) is 0.25 or less, the coating layer 6 can maintain high wear resistance without reducing the oxidation resistance or hardness. A particularly preferred range of "d" is $0.03 \leq d \leq 0.22$.

The metal M' represents at least one selected from Si, W, Mo, Ta, Hf, Nb, Zr, and Y. A coating layer 6 containing Si or W as M' can have high hardness and is therefore preferred. A coating layer 6 containing Nb or Mo as M' can have high wear resistance and oxidation resistance and is therefore preferred.

The nonmetal components of the coating layer 6, C and N, provide hardness and toughness necessary to a cutting tool. A particularly preferred range of "x" (composition ratio of N) is $0.9 \leq x \leq 1$. The composition of the coating layer 6 of the present invention can measured by energy dispersive X-ray spectroscopy (EDX) or X-ray photoelectron spectroscopy (XPS).

The ratio $Cr_{DR}/Cr_{DF}$ of the Cr content ratio $Cr_{DR}$ in the droplets 7 formed on the surface of the rake face 3 of the coating layer 6 to the Cr content ratio $Cr_{DF}$ in the droplets 7 formed on the surface of the flank face 4 is preferably $1.05 \leq Cr_{DR}/Cr_{DF} \leq 1.60$ from the viewpoint of optimization of the wear resistance in both the rake face 3 and the flank face 4.

The number of the droplets 7 having a size of 0.3 μm in a 10 μm square area of the rake face 3 is 15 to 50, preferably 18 to 30, from the viewpoint of relieving the heat due to passage of chips. The number of the droplets 7 on the rake face 3 is larger than that of the droplets 7 on the flank face 4, which is desirable for relieving the high temperature due to passage of chips on the rake face 3 and also for smoothening the surface of the flank face 4 to improve the finished surface quality.

Furthermore, the ratio of Cr in the average composition of the coating layer 6 of the rake face 3 is larger than that in the average composition of the coating layer 6 of the flank face 4, which is desirable for inhibiting crater wear and improving the removal of chips through an improvement in lubricity.

When the coating layer 6 contains Al, the ratio $Al_{DR}/Al_{DF}$ of the Al content ratio $Al_{DR}$ in the droplets 7 formed on the surface of the rake face 3 to the Al content ratio $Al_{DF}$ in the droplets formed on the surface of the flank face 4 is preferably $1.00 \leq Al_{DR}/Al_{DF} \leq 1.10$ from the viewpoint of optimization of the wear resistance in both the rake face 3 and the flank face 4. A particularly preferred range of the ratio $Al_{DR}/Al_{DF}$ is $1.00 \leq Al_{DR}/Al_{DF} \leq 1.02$. The ratio $Ti_{DR}/Ti_{DF}$ of the Ti content ratio $Ti_{DR}$ in the droplets 7 formed on the surface of the rake face 3 of the coating layer 6 to the Ti content ratio $Ti_{DF}$ in the droplets 7 formed on the surface of the flank face 4 is preferably $0.91 \leq Ti_{DR}/Ti_{DF} \leq 0.97$ from the viewpoint of optimization of the chipping resistance in both the rake face 3 and the flank face 4. A particularly preferred range of the ratio $Ti_{DR}/Ti_{DF}$ is $0.94 \leq Ti_{DR}/Ti_{DF} \leq 0.97$.

In another embodiment, the coating layer 6 is an alternating multilayer composed of a plurality of first layers 6a and a plurality of second layers 6b alternately laminated. In this structure, the hardness of the coating layer 6 is improved, and cracking can be prevented from progressing, resulting in improvement in fracture resistance. In this embodiment, not all the thin layers, i.e., the first layers 6a and the second layers 6b, may contain Cr, as long as at least one of the first layers 6a and the second layers 6b contain Cr.

The coating layer 6 can be formed by physical vapor deposition (PVD) such as arc ion plating or sputtering, and the droplets 7 can be preferably formed on the surface of the coating layer 6 by arc ion plating.

The Cr content ratio in the coating layer 6 of the rake face 3 is desirably higher than that in the coating layer 6 of the flank face 4, for achieving a good balance between the wear resistance and chip disposability of the cutting tool 1.

The material that is preferably used as the base body 2 is a cemented carbide or a cermet composed of a hard phase of which main component is tungsten carbide or titanium carbonitride and a binder phase of which main component is an iron group metal such as cobalt or nickel or is a ultra hard material such as a super high pressure sintered compact produced by firing, under a super high pressure, ceramics of which main component is silicon nitride or aluminum oxide, polycrystalline diamond, or cubic boron nitride and a binder phase of, for example, ceramics or an iron group metal.

(Production Process)

A process of producing the cutting tool of the present invention will now be described.

A base body having a shape of a tool is produced by a known method. Subsequently, a coating layer is formed on a surface of the base body. The coating layer can be preferably formed by physical vapor deposition (PVD) such as arc ion plating or sputtering. An example of formation of the coating layer will be described. In a case of producing the coating layer by ion plating, a metal target, a composite alloy target, or a sintered compact target containing metal titanium (Ti), metal aluminum (Al), metal chromium (Cr), and a predetermined metal M (wherein, M is at least one selected from Si, W, Mo, Ta, Hf, Nb, Zr, and Y) is set on a side wall of a chamber.

In the present invention, a main target is set on a side wall of a chamber, a target having a content ratio of Cr higher than those of other metals is set on the top face of the chamber, and a target having a content ratio of Cr lower than those of other metals is set on a side wall of the chamber. A film is formed by applying an arc current to each target. As a result, the composition of the resulting coating layer and the composition of the droplets can be adjusted to the compositions of the present invention. When a target produced by firing a mixture of metal powders, i.e., a sintered target, is used, the number of droplets deposited on the surface of the coating layer tends to be higher than that when an alloy target produced by melting metal components and solidifying them again is used.

The coating layer and the droplets are formed by ion plating or sputtering using these targets by evaporating the metal sources with, for example, arc discharge or glow discharge for ionization and, at the same time, reacting the metals to nitrogen ($N_2$) gas from a nitrogen source or methane ($CH_4$)/acetylene ($C_2H_2$) gas from a carbon source. On this occasion, the position of the base body is set such that the flank face is substantially parallel to the side wall of the chamber and that the rake face is substantially parallel to the top face of the chamber. The main target is applied with an arc current of 100 to 200 A, the sub-target containing a large amount of Cr component set to the top surface is applied with an arc current of 80 to 200 A, and the sub-target disposed on the side wall is optionally applied with an arc current of 120 to 250 A.

The composition of the droplets can be controlled to a predetermined range by applying a magnetic field to the generated ark plasma by, for example, disposing a magnet so as to be parallel to the target and thereby changing the state of each evaporated metal component in the plasma. In formation of the coating layer by ion plating or sputtering, it is preferable to apply a bias voltage of 35 to 200 V for producing a coating layer having high hardness and high adhesion with a base body in consideration of the crystal structure of the coating layer.

EXAMPLES

A tungsten carbide (WC) powder having an average particle diameter of 0.8 μm as a main component was mixed with 10% by mass of a metal cobalt (Co) powder having an average particle diameter of 1.2 μm, 0.1% by mass of vanadium carbide (VC) powder having an average particle diameter of 1.0 μm, and 0.3% by mass of a chromium carbide ($Cr_3C_2$) powder having an average particle diameter of 1.0 μm. The mixture was press-molded into a throw away tip of a DCGT11T302MFCQ shape, followed by debindering and firing in a vacuum of 0.01 Pa at 1450° C. for 1 hour to produce a cemented carbide. The rake face surface of each sample was polished by, for example, blasting or brushing. Furthermore, the resulting cemented carbide was subjected to edge treatment (honing) by brushing.

A coating layer having a rake face composition shown in Table 2 and a flank face composition shown in Table 4 was formed at a film-forming temperature of 540° C. by applying a bias voltage shown in Table 1 to the base body produced as in above and allowing predetermined ark currents to flow to the respective targets, the main target, the sub-target on the side wall, and the sub-target on the top face while a magnetic field being applied to the target materials generating the arc currents from the target direction with ring-shaped permanent magnets placed on the top and bottom faces of the chamber.

TABLE 1

| Sample No. | Main target | | Sub-target (top face) | | Sub-target (side wall) | | Film formation conditions | |
|---|---|---|---|---|---|---|---|---|
| | Composition | Current (A) | Composition | Current (A) | Composition | Current (A) | Bias voltage (V) | Applied magnetic field (G) |
| 1 | TiAlWNbSi | 130 | Cr | 140 | AlCr | 100 | 70 | 150 |
| 2 | TiAlW | 110 | AlCr | 150 | Ti | 100 | 50 | 100 |
| 3 | TiNb | 150 | Cr | 180 | Ti | 150 | 80 | 80 |
| 4 | TiAlNbCr | 200 | AlCrNb | 250 | Ti | 150 | 100 | 120 |
| 5 | TiAlY | 150 | AlCr | 50 | Al | 100 | 100 | 175 |
| 6 | TiAlNb | 100 | TiCr | 150 | AlSi | 50 | 80 | 120 |
| 7 | TiAlNbC | 120 | TiCr | 140 | Al | 80 | 150 | 70 |
| 8 | TiAlWSiNb | 140 | TiCr | 160 | — | | 75 | 70 |
| 9 | AlCr | 150 | AlCr | 150 | Nb | 100 | 75 | 100 |
| 10 | AlCr | 150 | Cr | 50 | TiCr | 100 | 50 | 100 |
| 11 | TiAlWSiNb | 140 | Cr | 160 | — | | 75 | — |
| 12 | TiAlCrSi | 130 | — | | Al | 100 | 80 | 130 |

TABLE 2

| Sample No. | Coating layer (total) Rake face composition | Detailed composition of coating layer rake face | |
|---|---|---|---|
| | | First layer | Second layer |
| 1 | $Ti_{0.40}Al_{0.46}Nb_{0.05}Cr_{0.06}W_{0.02}Si_{0.01}N$ | $Ti_{0.70}Al_{0.10}Cr_{0.10}Nb_{0.04}W_{0.04}Si_{0.02}N$ | $Al_{0.75}Cr_{0.25}N$ |
| 2 | $Ti_{0.42}Al_{0.39}Cr_{0.15}W_{0.04}N$ | $Ti_{0.20}Al_{0.60}Cr_{0.15}W_{0.05}N$ | $Ti_{0.50}Al_{0.35}Cr_{0.15}N$ |
| 3 | $Ti_{0.75}Nb_{0.10}Cr_{0.15}N$ | $Ti_{0.60}Nb_{0.20}Cr_{0.20}N$ | $Ti_{0.85}Cr_{0.15}N$ |
| 4 | $Ti_{0.40}Al_{0.49}Nb_{0.05}Cr_{0.06}N$ | $Ti_{0.30}Al_{0.55}Nb_{0.05}Cr_{0.10}N$ | $Ti_{0.55}Al_{0.30}Nb_{0.10}Cr_{0.05}N$ |
| 5 | $Ti_{0.42}Al_{0.52}Cr_{0.05}Y_{0.01}N$ | $Ti_{0.80}Al_{0.18}Y_{0.02}N$ | $Al_{0.90}Cr_{0.10}N$ |
| 6 | $Ti_{0.50}Al_{0.43}Cr_{0.04}Si_{0.02}Nb_{0.01}N$ | $Ti_{0.63}Al_{0.30}Cr_{0.05}Nb_{0.02}N$ | $Ti_{0.45}Al_{0.45}Cr_{0.05}Si_{0.05}N$ |
| 7 | $Ti_{0.45}Al_{0.4}Nb_{0.03}Cr_{0.07}C_{0.05}N$ | $Ti_{0.50}Al_{0.25}Nb_{0.05}Cr_{0.10}C_{0.10}N_{0.8}$ | $Ti_{0.40}Al_{0.50}Cr_{0.10}N$ |
| 8 | $Ti_{0.32}Al_{0.49}Nb_{0.05}Cr_{0.09}W_{0.02}Si_{0.03}N$ | $Ti_{0.32}Al_{0.49}Nb_{0.05}Cr_{0.09}W_{0.02}Si_{0.03}N$ | |
| 9 | $Al_{0.40}Cr_{0.35}Nb_{0.25}N$ | $Al_{0.60}Cr_{0.40}N$ | $Al_{0.35}Cr_{0.15}Nb_{0.50}N$ |
| 10 | $Ti_{0.10}Al_{0.75}Cr_{0.15}N$ | $Al_{0.75}Cr_{0.25}N$ | $Ti_{0.50}Cr_{0.50}N$ |
| 11 | $Ti_{0.30}Al_{0.50}Nb_{0.05}Cr_{0.10}W_{0.02}Si_{0.03}N$ | $Ti_{0.30}Al_{0.50}Nb_{0.05}Cr_{0.10}W_{0.02}Si_{0.03}N$ | |
| 12 | $Ti_{0.42}Al_{0.52}Cr_{0.04}Si_{0.02}N$ | $Ti_{0.80}Al_{0.08}Cr_{0.08}Si_{0.04}N$ | AlN |

Three random positions of each of the rake face and the flank face on the surface of the coating layer and the droplets formed on the rake face and the flank face of each sample were observed. The numbers of droplets having a diameter of 0.3 μm or more in any five visual fields of 10×10 μm were counted, and the average number of the droplets was calculated. The composition of each droplet having a diameter of 0.3 μm or more was measured by energy dispersive spectroscopy (EDS) (EDAX manufactured by Ametek Inc.). The average value of the compositions was calculated as the average composition of the droplets on each surface of the rake face and the flank face. In Table 3, $Cr_{DR}$, $Al_{DR}$, and $Ti_{DR}$ respectively denote the average contents (% by atom) of Cr, Al, and Ti in the droplets formed on the rake face, and $Cr_{DF}$, $Al_{DF}$, and $Ti_{DF}$ respectively denote the average contents (% by atom) of Cr, Al, and Ti in the droplets formed on the flank face.

A cutting test was performed using the resulting external cutting tool, a throw away tip of a DCGT11T302MFCQ shape, under the following cutting conditions. The results are shown in Table 4.

Cutting method: external turning
Work material: carbon steel (S45C)
Cutting speed: 130 m/min
Feeding: 0.05 mm/rev
Cutting depth: 1.2 mm
Cutting state: wet
Evaluation: The rake face after machining of 500 pieces of the work material was observed to inspect the welding state. The number of pieces that were machined until the end of the tool life was counted, and the wear mode at that time was observed.

TABLE 3

| | Rake face droplet | | | | Flank face droplet | | | | Composition ratio | | |
|---|---|---|---|---|---|---|---|---|---|---|---|
| Sample No. | Number of droplets | $Cr_{DR}$ | $Ti_{DR}$ | $Al_{DR}$ | Number of droplets | $Cr_{DF}$ | $Ti_{DF}$ | $Al_{DF}$ | $Cr_{DR}/Cr_{DF}$ | $Ti_{DR}/Ti_{DF}$ | $Al_{DR}/Al_{DF}$ |
| 1 | 27.2 | 12.3 | 41.2 | 46.5 | 20.2 | 11.1 | 43.4 | 45.5 | 1.11 | 0.95 | 1.02 |
| 2 | 31.1 | 14.2 | 43.3 | 42.5 | 16.6 | 7.9 | 49.2 | 42.9 | 1.80 | 0.88 | 0.99 |
| 3 | 42.0 | 22.8 | 77.3 | — | 28.2 | 22.0 | 78.0 | — | 1.04 | 0.99 | — |
| 4 | 26.1 | 9.8 | 41.2 | 49.0 | 22.3 | 9.1 | 43.8 | 47.1 | 1.08 | 0.94 | 1.04 |
| 5 | 19.3 | 7.7 | 42.4 | 49.9 | 15.3 | 6.3 | 43.7 | 49.9 | 1.21 | 0.97 | 1.00 |
| 6 | 28.3 | 6.4 | 51.5 | 42.1 | 23.8 | 5.0 | 53.6 | 41.3 | 1.26 | 0.96 | 1.02 |
| 7 | 23.7 | 13.7 | 46.4 | 40.0 | 16.8 | 11.3 | 50.9 | 37.7 | 1.20 | 0.91 | 1.06 |
| 8 | 24.3 | 17.6 | 33.0 | 49.5 | 23.9 | 17.0 | 35.0 | 48.0 | 1.03 | 0.94 | 1.03 |
| 9 | 43.0 | 59.6 | — | 40.4 | 39.6 | 58.8 | — | 41.2 | 1.01 | — | 0.98 |
| 10 | 50.2 | 14.0 | 10.3 | 75.8 | 44.8 | 7.5 | 17.5 | 75.0 | 1.85 | 0.59 | 1.01 |
| 11 | 27.1 | 18.1 | 30.9 | 51.0 | 31.9 | 20.8 | 29.7 | 49.5 | 0.87 | 1.04 | 1.03 |
| 12 | 35.2 | 5.3 | 43.3 | 51.5 | 19.9 | 5.3 | 43.7 | 51.0 | 0.99 | 0.99 | 1.01 |

TABLE 4

| Sample No. | Coating layer Flank face composition | Cutting results | | |
|---|---|---|---|---|
| | | Degree of welding of rake face | Number of items machined | Appearance of cutting edge |
| 1 | $Ti_{0.42}Al_{0.45}Nb_{0.05}Cr_{0.05}W_{0.02}Si_{0.01}N$ | slight | 1810 | regularly worn |
| 2 | $Ti_{0.42}Al_{0.39}Cr_{0.15}W_{0.04}N$ | middle | 1150 | regularly worn |
| 3 | $Ti_{0.76}Nb_{0.08}Cr_{0.16}N$ | middle | 1100 | regularly worn |
| 4 | $Ti_{0.42}Al_{0.52}Nb_{0.04}Cr_{0.02}N$ | slight | 1700 | regularly worn |
| 5 | $Ti_{0.42}Al_{0.52}Nb_{0.01}Cr_{0.04}Y_{0.01}N$ | low | 1350 | regularly worn |
| 6 | $Ti_{0.51}Al_{0.44}Nb_{0.01}Cr_{0.02}Si_{0.02}N$ | slight | 1500 | regularly worn |
| 7 | $Ti_{0.38}Al_{0.53}Nb_{0.04}Cr_{0.05}C_{0.2}N_{0.8}$ | low | 1250 | regularly worn |
| 8 | $Ti_{0.35}Al_{0.48}Nb_{0.02}Cr_{0.08}W_{0.04}Si_{0.03}N$ | low | 1000 | slightly chipped |
| 9 | $Al_{0.45}Cr_{0.3}Nb_{0.25}N$ | high | 900 | worn |
| 10 | $Ti_{0.11}Al_{0.75}Cr_{0.14}N$ | low | 1050 | worn |
| 11 | $Ti_{0.29}Al_{0.49}Nb_{0.02}W_{0.04}Cr_{0.13}Si_{0.03}N$ | high | 500 | slightly chipped |
| 12 | $Ti_{0.42}Al_{0.51}Nb_{0.03}Cr_{0.02}Si_{0.02}N$ | high | 850 | welded and highly worn |

The results shown in Tables 1 to 4 demonstrate that in the sample No. 11 having a Cr content ratio in the average composition of droplets existing on the rake face being lower than that in the average composition of the droplets existing on the flank face, the work material welded to the rake face is high, crater wear rapidly progresses, and the tool life is short and that in also the sample No. 12 having a Cr content ratio in the average composition of the droplets existing on the rake face being the same as that in the average composition of the droplets existing on the flank face, welding to the rake face is high, and wear rapidly progresses.

In contrast, the samples No. 1 to 10 that are within the scope of the present invention all have high wear resistance and exhibit satisfactory cutting performance to give smooth machined surfaces.

REFERENCE SIGNS LIST

1 cutting tool
2 base body
3 rake face
4 flank face
5 cutting edge
6 coating layer
7 droplet

The invention claimed is:

1. A cutting tool comprising a rake face and a flank face and further comprising:
   a base member; and
   a coating layer
      having a composition represented by a chemical formula of $Cr_aM_{1-a}(C_{1-x}N_x)$, wherein M represents at least one selected from Ti, Al, Si, W, Mo, Ta, Hf, Nb, Zr, and Y, $0.01 \leq a \leq 0.5$, and $0 \leq x \leq 1$,
   said coating layer being provided on the base member, forms the surface of the rake face and the flank face and comprises a cutting edge at an intersecting ridge line between the rake face and the flank face,
   wherein the coating layer further comprises droplets thereon, and an average composition of the droplets provided on the rake face has a Cr content that is higher than the Cr content of the average composition of the droplets provided on the flank face.

2. The cutting tool according to claim 1, wherein the coating layer further contains Ti and Al and has a composition represented by a chemical formula of $Cr_{a'}Ti_bAl_cM'_d(C_{1-x}N_x)$, (wherein, M' represents at least one selected from Si, W, Mo, Ta, Hf, Nb, Zr, and Y, $0.01 \leq a' \leq 0.25$, $0.3 \leq b \leq 0.8$, $0 \leq c \leq 0.6$, $0 \leq d \leq 0.25$, $a'+b+c+d=1$, and $0 \leq x \leq 1$.

3. The cutting tool according to claim 1, wherein a number of the droplets provided on the rake face is higher than the number of the droplets provided on the flank face.

4. The cutting tool according to claim 1, wherein the coating layer on the rake face has a Cr content that is higher than the Cr content in the coating layer on the flank face.

5. The cutting tool according to claim 1, wherein the coating layer has an alternating multilayer structure composed of a plurality of thin layers having different compositions alternately laminated.

6. The cutting tool according to claim 1, wherein the coating layer further comprises:
   first thin layers each having a first composition; and
   second thin layers each having a second composition, the second composition different from the first composition;
   wherein the first thin layers and the second thin layers are alternatingly stacked.

* * * * *

UNITED STATES PATENT AND TRADEMARK OFFICE
CERTIFICATE OF CORRECTION

| | | |
|---|---|---|
| PATENT NO. | : 9,085,032 B2 | |
| APPLICATION NO. | : 14/234617 | |
| DATED | : July 21, 2015 | |
| INVENTOR(S) | : Yoshiki Sakamoto et al. | |

It is certified that error appears in the above-identified patent and that said Letters Patent is hereby corrected as shown below:

In the Specification

Column 7, TABLE 2, Sample No.1: Please insert --Ti--, between the "N" and "0.70".

Signed and Sealed this
Fifteenth Day of March, 2016

Michelle K. Lee
*Director of the United States Patent and Trademark Office*